US012134280B2

(12) United States Patent
Tamulevicius et al.

(10) Patent No.: US 12,134,280 B2
(45) Date of Patent: Nov. 5, 2024

(54) OPTICAL DEVICE WITH ORDERED SCATTERER ARRAYS FOR SECURE IDENTITY AND A METHOD OF PRODUCING THE SAME

(71) Applicant: Kaunas University of Technology, Kaunas (LT)

(72) Inventors: Tomas Tamulevicius, Kauno raj. (LT); Mindaugas Juodenas, Kaunas (LT); Asta Tamuleviciene, Kauno raj. (LT); Tomas Klinavicius, Kaunas (LT); Sigitas Tamulevicius, Kaunas (LT)

(73) Assignee: Kaunas University of Technology, Kaunas (LT)

( * ) Notice: Subject to any disclaimer, the term of this patent is extended or adjusted under 35 U.S.C. 154(b) by 812 days.

(21) Appl. No.: 17/232,154

(22) Filed: Apr. 16, 2021

(65) Prior Publication Data

US 2022/0314682 A1 Oct. 6, 2022

(30) Foreign Application Priority Data

Apr. 2, 2021 (EP) ..................................... 21166819

(51) Int. Cl.
*B42D 25/328* (2014.01)
*B29D 11/00* (2006.01)
(Continued)

(52) U.S. Cl.
CPC ...... *B42D 25/328* (2014.10); *B29D 11/00769* (2013.01); *G02B 5/1861* (2013.01);
(Continued)

(58) Field of Classification Search
CPC ................ B42D 25/328; B42D 25/324; B29D 11/00769; G02B 55/1861; G03F 7/001;
(Continued)

(56) References Cited

U.S. PATENT DOCUMENTS 7,252,699 B2 8/2007 Perry et al.
8,711,356 B2 4/2014 Offermans et al.
(Continued)

FOREIGN PATENT DOCUMENTS

CA 2468604 A1 6/2003
WO 2003009225 A2 7/2002
WO 2009137203 A2 11/2009

OTHER PUBLICATIONS

Marcus S. Carstensen, Xiaolong Zhu, Oseze Esther Iyore, N. Asger Mortensen, Uriel Levy, Anders Kristensen, Holographic Resonant Laser Printing of Metasurfaces Using Plasmonic Template. ACS Photonics 2018, 5, 1665-1670. doi.org/10.1021/acsphotonics.7b01358.

(Continued)

*Primary Examiner* — Justin V Lewis
(74) *Attorney, Agent, or Firm* — Koivula & Somersalo, LLC

(57) ABSTRACT

An optical device with ordered scatterer arrays for secure identity and a method of producing the same This invention discloses a method for configurable spatial control and modification of optically active resonantly coupled scatterer arrays to produce identifiable security features and a corresponding photonic secure identity device. The invention comprises at least the steps of (i) producing a deposition template from said master stamp, (ii) synthesis of a plasmonic particle colloid, (iii) producing an optically active, two-dimensional security tag template using self-assembly of said particles on said deposition template, (iv) producing a customized secure identity device from said security tag template by selective removal or modification of optical properties using ultrashort laser pulses. The produced customized plasmonic-photonic device can then be used as secure identity and anti-counterfeiting means. The device exploits customized spatial control and modification of optically active plasmonic particle arrays demonstrating surface lattice resonance optical signature to produce easily identifiable security features.

15 Claims, 8 Drawing Sheets

(51) Int. Cl.
  *G02B 5/18* (2006.01)
  *G03F 7/00* (2006.01)
  *G03H 1/00* (2006.01)
  *G03H 1/04* (2006.01)

(52) U.S. Cl.
  CPC ............ *G03F 7/001* (2013.01); *G03H 1/0011* (2013.01); *G03H 1/0493* (2013.01); *G03H 2001/0497* (2013.01)

(58) Field of Classification Search
  CPC .............. G03H 1/0011; G03H 1/0493; G03H 2001/0497
  USPC ....... 283/67, 70, 72, 74, 87, 91, 94, 98, 901
  See application file for complete search history.

(56) References Cited

U.S. PATENT DOCUMENTS

| | | | |
|---|---|---|---|
| 8,759,116 | B2 | 6/2014 | Schultz et al. |
| 8,840,146 | B2 | 9/2014 | Stalder |
| 9,081,150 | B2 | 7/2015 | Magnusson |
| 9,176,473 | B1 | 11/2015 | Lieberman |
| 2005/0248821 | A1 | 11/2005 | Noehte et al. |
| 2007/0165209 | A1 | 7/2007 | Natan et al. |
| 2009/0122412 | A1* | 5/2009 | Steenblik ............... B42D 25/29 283/72 |
| 2010/0050901 | A1 | 3/2010 | Biris et al. |
| 2011/0027499 | A1 | 2/2011 | Wolf et al. |
| 2012/0062886 | A1 | 3/2012 | Piotti et al. |

OTHER PUBLICATIONS

Shikai Denga, Ran Li, Jeong-Eun Park, Jun Guan, Priscilla Choo, Jingtian Hu, Paul J. M. Smeets, Teri W. Odom, Ultranarrow plasmon resonances from annealed nanoparticle lattices. PNAS 2020, vol. 117 No. 38 23380-23384. doi. org/10.1073/pnas. 2008818117.

Andrea Tao, Prasert Sinsermsuksakul, and Peidong Yang, Polyhedral Silver, Nanocrystals with Distinct Scattering Signatures. Angew. Chem. Int Ed. 2006, 45, 4597-4601. doi.org/10.1002/anie. 200601277.

Neus G. Bastus, Florind Merkoci, Jordi Piella, and Victor Puntes, Synthesis of Highly Monodisperse Citrate-Stabilized Silver Nanoparticles of up to 200 nm: Kinetic Control and Catalytic Properties. Chem. Mater. 2014, 26, 2836-2846. doi.org/10.1021/cm500316k.

\* cited by examiner

501

601

OPTICAL DEVICE WITH ORDERED SCATTERER ARRAYS FOR SECURE IDENTITY AND A METHOD OF PRODUCING THE SAME

FIELD OF INVENTION

The present invention relates to the fields of plasmonics, photonics, optical devices, anti-counterfeiting, and secure identity. Specifically, it discloses a method of spatial control and modification of optically active scatterer arrays to produce identifiable security features, and a correspondingly producible photonic secure identity device.

BACKGROUND ART

Secure identity devices are, for example, labels comprising a pattern of surface relief that reproduces an easily identifiable visual security feature, for example, disclosed in U.S. Pat. No. 8,840,146B2 and PCT application WO2003009225A2. This surface patterning technology allows to identify products and to distinguish original products from their counterfeits as the labels usually require complex apparatus to produce. The level of protection depends on the integration of different secure identity technologies. Dot-matrix holograms originated using holographic lithography are used as periodic surface relief microstructures that can be embossed in reflective surfaces and used for anti- counterfeiting, as disclosed in EP0467601B1/U.S. Pat. No. 5,291,317. A digital computer-generated hologram (CGH) is often used along with dot-matrix holograms where a hidden image is revealed by laser light diffracting from a dedicated area containing CGH (WO2002084411A1/US2005/0248821A1). Micro- or nano-texts of varying spacing and fonts are used for secure documents because they are irreproducible with custom digital printing techniques (disclosed in U.S. Pat. No. 9,176,473B1). Security features can be improved by using nanoparticles with optical signatures such as fluorescence or phosphorescence (described in WO2009137203A2 and CA2468604), surface enhanced Raman spectroscopy (described in US20070165209A1 and US20120062886A1), or light scattered due to the surface plasmon resonance (LSPR) (described in U.S. Pat. No. 8,759,116B2). High-quality nanoparticle patterns can be observed as a homogeneous scattered colour under dark field illumination optical microscope and the spectral features can be registered with a spectrometer, described also in U.S. Pat. No. 8,759,116B2. Additionally, diffraction-based interparticle coupling can provide unique new features. A so-called surface lattice resonance (SLR) can be generated (in U.S. Pat. No. 8,711,356B2) by merging the diffractive properties of the periodic structures, namely the resonant wavelength of the Rayleigh anomaly (RA) (disclosed in U.S. Pat. No. 9,081,150B2), with Mie scattering resonances. However, the use of this phenomenon in anti-counterfeiting has not been disclosed so far. Furthermore, unique but mild randomness in the particle arrays produced using colloidal methods as opposed to lithography can further improve the level of security, but this has also not been disclosed so far.

In US patent application US2010/0050901A1, various complex structures (nano/microparticles) are incorporated into a tag providing different optical, magnetic and spectroscopic identification codes. The size and shape of the tag can be tailored for many types of products ranging from pharmaceuticals, auto and airplane parts all the way to apparel goods. By integrating several different nano/microstructures with various optical, electrical and magnetic properties, significant barriers are introduced to the counterfeiters attempting to replicate the tag. The latter is easily incorporated to different types of products and is detected with various types of handheld readers/detectors depending on the complexity of the security level. The tag may detect environmental materials or conditions. The working principle of the tag is based on random arrays of nanoparticles, therefore it does not feature the SLR optical effect. Moreover, no customization options are disclosed.

The US patent application US2007/0165209A1 provides methods for applying security tags and/or data to currency and other documents and systems. The authentication of the tags requires the use of a Raman-active molecule and a laser to excite the Raman scattering that is detected as an optical signature and enhanced by the presence of metal nanoparticles. The invention disclosed herein does not rely on Raman scattering effects.

The U.S. Pat. No. 7,252,699B2 discloses that continuous, conducting metal patterns can be formed from metal films containing nanoparticles by exposure to radiation. The metal patterns can be one, two, or three-dimensional and have high resolution resulting in feature sizes in the order of microns down to nanometers. Compositions containing the nanoparticles coated with a ligand and further including a dye, a metal salt, and either a matrix or an optional sacrificial donor are also disclosed. The method allows to define complex patterns, but they are continuous and therefore do not have any arrangement satisfying the SLR condition and therefore lack the SLR resonance.

Carstensen et al. [1] presents a technique for the design and manufacturing of plasmonic metasurfaces based on ultrafast laser printing with a spatial light modulator. As a proof of principle, they have used this technique to laser print a plasmonic metalens as well as high resolution plasmonic colour decorations. The high throughput holographic resonant laser printing approach enables on-demand mass production of customized metasurfaces. The templates with arranged nanoparticle arrays used for customisation are made using lithography. This method is not able to provide the uniqueness of the tag through minor defects generated by colloidal methods. The quality of separate particles and their selected arrangement does not provide an expressed SLR peak. Furthermore, the method discloses only the modification of scatterers, but not their complete removal.

The US patent application US2011/0027499A1 is the most relevant document to the present invention, where US2011/0027499A1 discloses a method of nanoparticle printing including: contacting printing plate with a target substrate, while the printing plate is contacting the target substrate, illuminating nanoparticles on the printing plate with intense flashes of laser light, or subjecting the nanoparticles to microwave radiation, such that energy is selectively transferred into the particles, increasing a local temperature of the particles which causes an increased interaction of the particles with the target substrate and produces a strong junction and removes the particles from the printing plate; and peeling off the printing plate from the target substrate. The method discloses the nanoparticle transfer only but does not disclose its use: neither the use of the printing plate with the particles removed according to the customised pattern, nor the use of the transferred particle patterns. Moreover, it does not disclose any modification of the nanoparticles or their optical coupling (SLR).

The main drawbacks of the above reviewed are the absence of the surface lattice resonance (SLR) phenomenon, the lack of scatterer modification options, and lack of mild randomness that can improve the security of the device while maintaining the SLR condition. The optical scatterers are either randomly distributed over the surface, or their scattering properties do not fulfil the SLR condition. Even when they are positioned to ensure the desired optical signature, the fabrication method requires expensive and demanding clean room lithography processes. Furthermore, these processes result in unideal scatterers because they are made from polycrystalline films. Laser irradiation of a silver precursor-containing interface allows custom patterns, but it does not ensure sufficient ordering of the scatterers. Additionally, customization of ideally positioned scatterer arrays is not able to provide distinct features generated by colloidal methods. These features make each tag unique and the forgery even more complicated, i.e., positional uncertainty within a trapping site, missing scatterers, twin scatterer deposits, triplets, quadruplets, etc. Traditional dot-matrix holograms and computer-generated holograms (CGHs) disclosed in prior art documents are based solely on the structures that are bigger than the wavelength of light. Meanwhile, the use of subwavelength scatterer arrays, where their arrangement would carry information about security features instead of the surface relief, will introduce a new level of security without compromising on the well-established security features. The above advantages implemented in further disclosed secure identity devices make them impossible to counterfeit, therefore, advanced over the prior art.

SUMMARY OF INVENTION

The present invention relates to a photonic secure identity and anti-counterfeiting device—a tag, which exploits a custom spatial control and modification of optically active scatterer arrays. Said arrays are arranged to produce security features that are advanced over the prior art technologies because of their irreproducibility and simultaneously are easily verifiable. The novelty is considered in using scatterer arrays as the base—or template—of the custom tag, and in customization performed via selective removal and/or modification of the optical properties of said scatterers to provide easier validation, additional security features, and visual appeal; irreproducibility through small randomness in the pattern of scatterers, making each tag unique.

The method to produce an embodiment of the invention is disclosed, comprising (i) the production of a substrate, (ii) the synthesis of a plasmonic nanoparticle colloid, (iii) the method to produce an optically active, two-dimensional security tag template using self-assembly of scatterers on said substrate, (iv) the method to produce custom security features by selective removal or modification of optical properties using ultrashort laser pulses. Depending on the chosen modification pattern and its size, the security features are verifiable using bright field optical microscopy, dark field optical microscopy, by naked eye, UV-vis-NIR spectrophotometry or on a screen using monochromatic light illumination.

Technical problem. The advancing forgery techniques demand anti-counterfeiting methods to stay one step ahead. Holographic, CGH, micro- and nanotexts imposed on flat surfaces are widely used and their origination apparatuses are readily available. Anti-counterfeiting security tags based on a customized regular scatterer array could ensure a high level of protection against forgery, but it is a high-resolution lithography demanding method. Patterning of scatterers in defined places requires either long serial exposures or sets of masks. Electron beam lithography, deep UV lithography, etc. in combination with vacuum deposition methods are capable to pattern materials with high precision, but they require clean-room facilities. The lithography approach is also followed by development, metal deposition and other processes. Moreover, the resulting metal scatterers are usually polycrystalline and thermal post-processing under elevated temperatures is required to enhance their optical quality, according to Shikai Denga et al.[2].

Solution. The solution proposed herein relies on using an optical scatterer array-based template as the base of a custom tag, the array being ordered with a mild randomness, and customization being performed via selective removal or modification of said optical scatterers. Optical scatterers can be efficiently synthesized using wet chemistry methods. The advantage is that it can be performed in a conventional laboratory and at a big scale. The crystalline quality of produced materials is often better and monodispersity can be maintained according to Andrea Tao at al. [3] and Neus G. Bastus et al. [4]. Well-defined arrays of scatterers can then be formed by colloidal deposition methods, such as template-based self-assembly, i.e., by drying a colloid on a patterned substrate under predefined conditions. Deposition of a colloidal scatterer solution on a slowly translated deposition template with size-matched obstacles ensures high positioning accuracy and nearly error-free deposition, as mentioned in the U.S. Pat. No. 7,520,951B1. Naturally occurring deposition defects only add to the security of the device, making every tag unique and irreproducible. As an additional security feature, the secure identity device disclosed herein can generate a surface lattice resonance through diffractive interparticle coupling. Making a customized sample featuring SLR and validation of its authenticity is straightforward, but making a direct copy, i.e., counterfeiting, of such an element is a technologically complicated task; therefore, it can be used as an industrially applicable anti-counterfeiting security tag.

A method is proposed to create unique scatterer arrays and subsequently customize them using laser-assisted post-processing consequently adding-additional security features and visual appeal. This complex customized photonic device can then be used as a secure identity and anti-counterfeiting means. The device exploits customized spatial control and modification of optically active scatterer arrays to produce easily identifiable security features.

A method to produce an embodiment of the same is disclosed, comprising:

(i) the production of a patterned substrate (deposition template);

(ii) the synthesis of plasmonic Ag particle colloid solution;

(iii) the method to produce an optically active, two-dimensional security tag template using self-assembly of said scatterers on said substrate, (iv) the method to produce a customized anti-counterfeiting tag from said security tag template by selective removal or modification of optical properties using ultrashort laser pulses.

Depending on the chosen modification pattern and its size, the customization effect is visible using dark field optical microscopy, by naked eye or on a screen using monochromatic light illumination.

Effects. The security tag contains intrinsic optical effects that are hard to counterfeit, namely, a brilliant colour observable under dark field illumination and characteristic narrow dips in transmission spectra. Laser irradiation enables customization of the scatterer array where micro- and nanosize features are imposed by selective removal or modification of the scatterers. This method avoids repeated use of cleanroom-based lithography techniques for each new customized anti-counterfeiting tag. A generic optical scatterer array serves as a starting point, i.e., a security tag template, for customization and use as a customized security tag. Wet chemistry synthesized nanoparticles are highly monodisperse and single crystalline. This ensures the required optical properties without the necessity for any thermal pre- or post-treatment. The laser irradiation-based customization using a diffraction limited spot size enables a sufficiently high patterning resolution required by security tag applications or even subwavelength resolution when interference pattern irradiation is used.

DESCRIPTION OF DRAWINGS

The drawings are provided as a reference to possible embodiments and are not intended to limit the scope of the invention. Neither of the drawings and graphs presented herein should be construed as limiting the scope of the invention, but merely as an example of a possible embodiment.

DETAILED DESCRIPTION OF INVENTION

Figure 1:
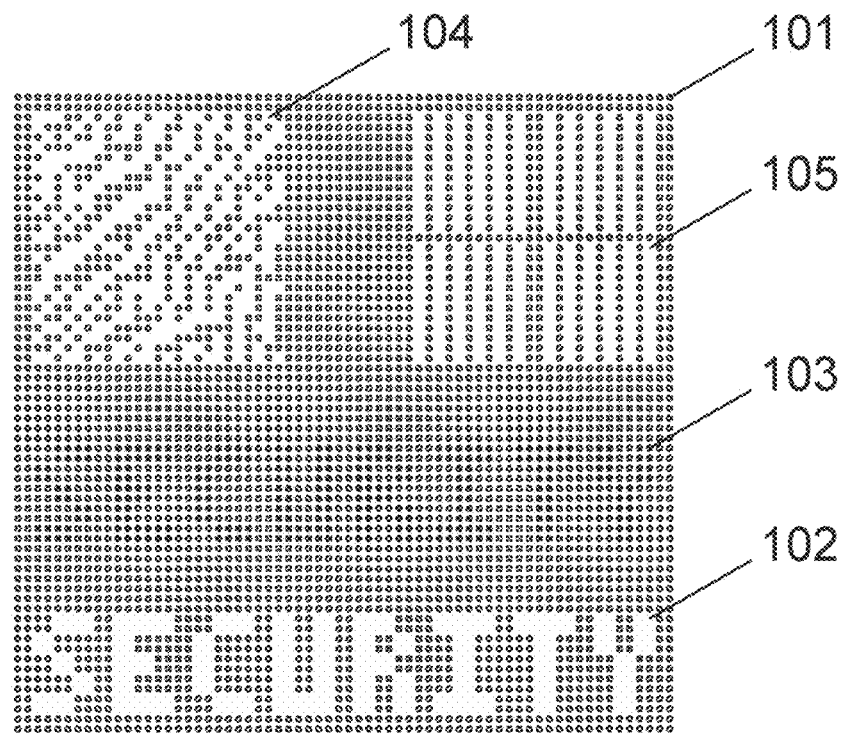
FIG. 1 shows a customized regular scatterer array by this invention.
Figure 2:
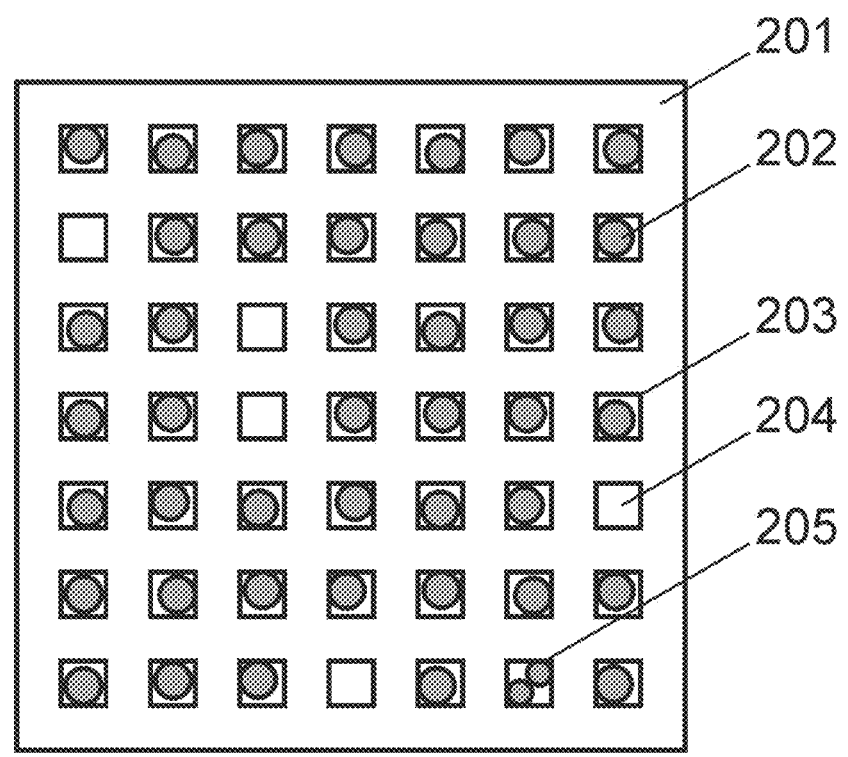
FIG. 2 shows a regular scatterer array arranged in a rectangular pattern with unique defects.
Figure 3:
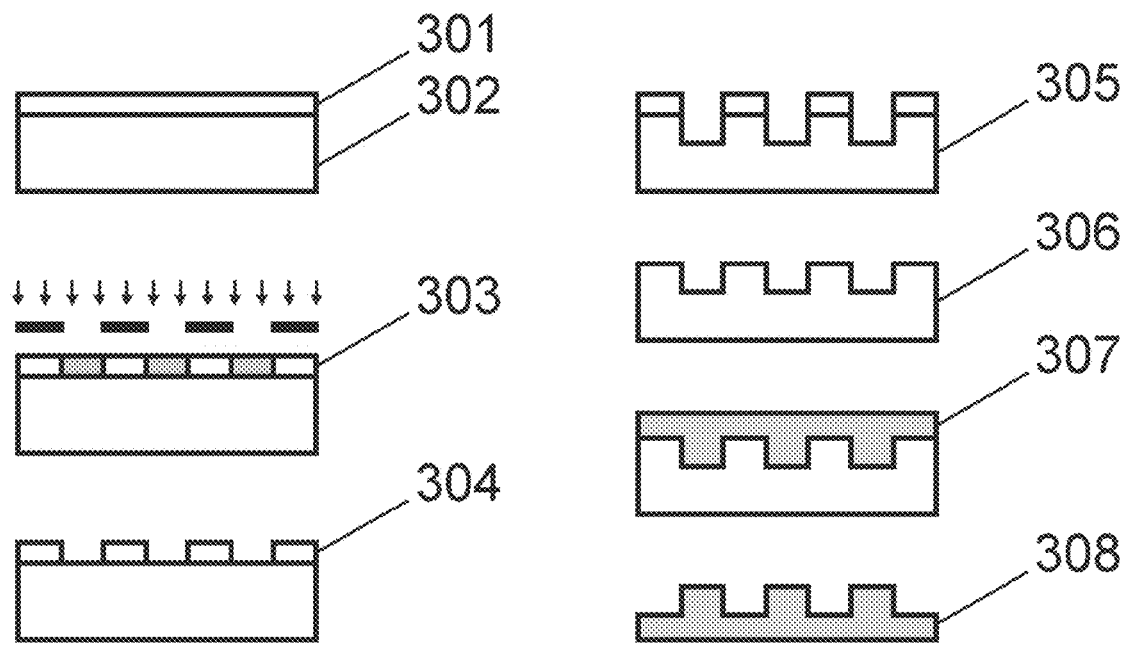
FIG. 3 shows a process to fabricate a patterned substrate (also known as deposition template) for the security tag.

A security tag comprises at least two features that are essential: a substrate (201) and a plurality of optical scatterers (202) affixed to said substrate. The task of identification and anti-counterfeiting protection with added levels of security that are advanced over the prior art is achieved by a unique arrangement of said optical scatterers and by the possibility of complete removal or modification of their properties in relation to each other. Effects generated by this device are impossible to fake and are verifiable either visually, by means of microscopy, by means of spectroscopy, or any combination thereof depending on the features included in the device.

In one of the possible embodiments of the invention, the substrate could comprise technological superficial features composed in a pattern, e.g., identical pits (203), that are essential for template-assisted particle deposition methods. The initial uniqueness of every tag can then be achieved by using a self-assembly technique, wherein the optical scatterers are made to closely follow the physical pattern on the substrate, but in such a way that some randomness is maintained by some scatterers not falling in their predefined positions and leaving them empty (204). Additionally, the holes can be larger than the lateral dimension of the particle, which introduces slight positional randomness in every pit (202, 601). Furthermore, if the traps are sufficiently large (or the scatterers are sufficiently small), some pits could randomly acquire more than one scatterer (205, 601).

In one embodiment, the substrate with superficial features could be provided by means of standard nanofabrication routes, e.g., electron beam lithography, dry etching, and soft lithography. A standard technique involves cleaning a silicon wafer (302), spin-coating a layer of electron/photosensitive/nanoim print resist layer (301), pre-processing according to manufacturer instructions, and exposing (303) and developing a pattern (304) for optical scatterers to eventually follow. In this case, the substrate is the resist layer (304), and the superficial features are the resulting developed structures.

In a different embodiment, the pattern can be transferred to a different material, e.g., silicon, by an additional etching step of the wafer (305) using a variety of different dry etching recipes. To efficiently produce holes in silicon using negative-tone resist and e-beam lithography, an additional lift-off step is required with a thin metal layer, e.g., A1, to produce a hard mask. If dot-exposure is used with a positive-tone resist, the polymer mask itself can be used as an etching mask. In the embodiments discussed herein, an ion-assisted $SF_6$ plasma etching with a passivating gas ($C_4F_8$), or a cryogenic etch at −120° C. and $SF_6/O_2$ plasma is used. In this case, the substrate is a patterned silicon wafer (306).

In another embodiment, the substrate could comprise a polymer substrate made using soft lithography by replicating a silicon (or other material) master mould produced by the steps described above. The produced master stamp (306) should preferably be coated with a self-assembled monolayer of FDTS as an anti-adhesion coating. The replica of the inverse relief of the silicon master is made in polydimethylsiloxane by means of soft lithography (307). 10:1 mixture of prepolymer and curing agent is mixed per manufacturer (Sylgard) instructions and degassed in a vacuum chamber. The mixture is poured over the silicon mould and a cover slip is placed on top to help spread it evenly and later provide a rigid substrate for the replica. The stack is cured at a temperature and for a period described in the manufacturer instructions. The patterned replica mould (308) is then separated by peeling it off together with the cover slip and serves as the substrate.

The task of optical scatterers in an embodiment of the invention is to scatter light with some dependency to wavelength, i.e., to produce a colour. The properties of scattering depend on the size and shape of the scatterers and the dielectric functions of the scattering (202) and the surrounding (201) material; both metal and dielectric materials can be used. In one embodiment, said scatterers could be plasmonic nanoparticles made of Ag. Silver nanoparticles having the LSPR in the visible or /and NIR wavelength range can be synthesised using wet chemistry methods aiming at high monodispersity. Monodisperse spherical silver nanoparticles can be synthesized using seeded-growth approach as by Neus G. Bastus et al. [4]. The variation of the concentration and ratio of the precursors allows to synthesize 20-270 nm nanoparticles with a tight deviation in diameter. Alternatively, particles of different geometry can be synthesized using the polyol synthesis route as by Andrea Tao et al. [3].

Figure 4:
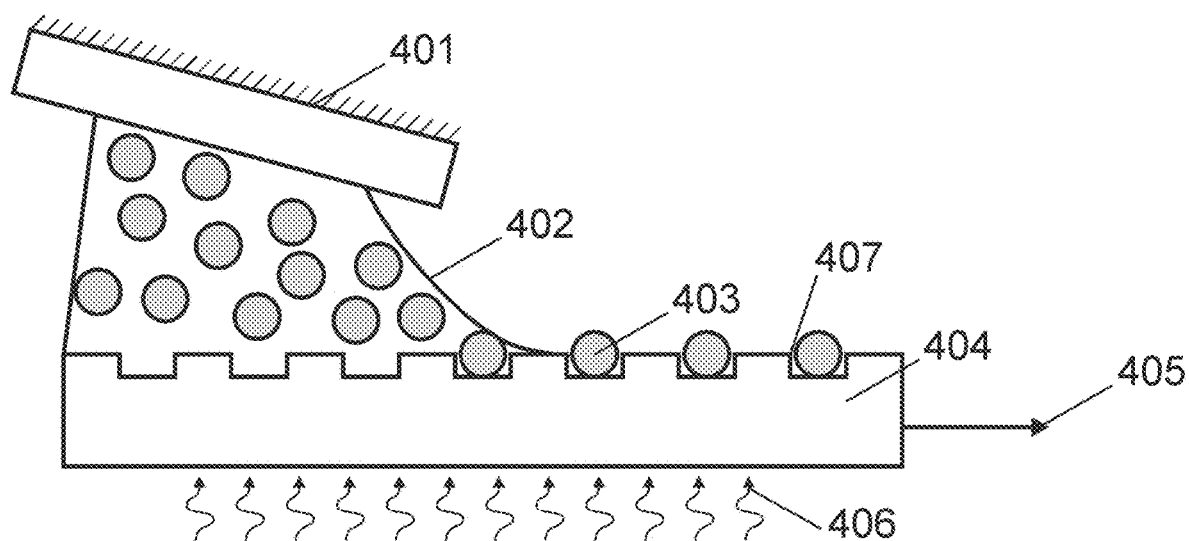
FIG. 4 shows the deposition method to produce a security tag template, where a drop of colloidal solution confined by a glass cover slide is slowly translated over a temperature-controlled substrate with size-matched obstacles. Horizontal arrow indicates the direction of translation.
Figure 5:
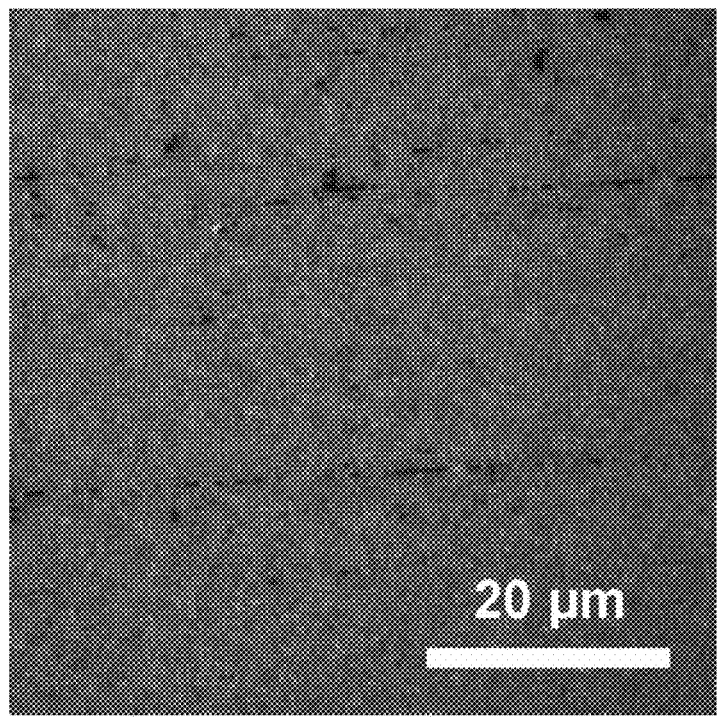
FIG. 5 shows a dark field optical microscope micrograph of a scatterer array.
Scale bar 20 μm
Figure 6:
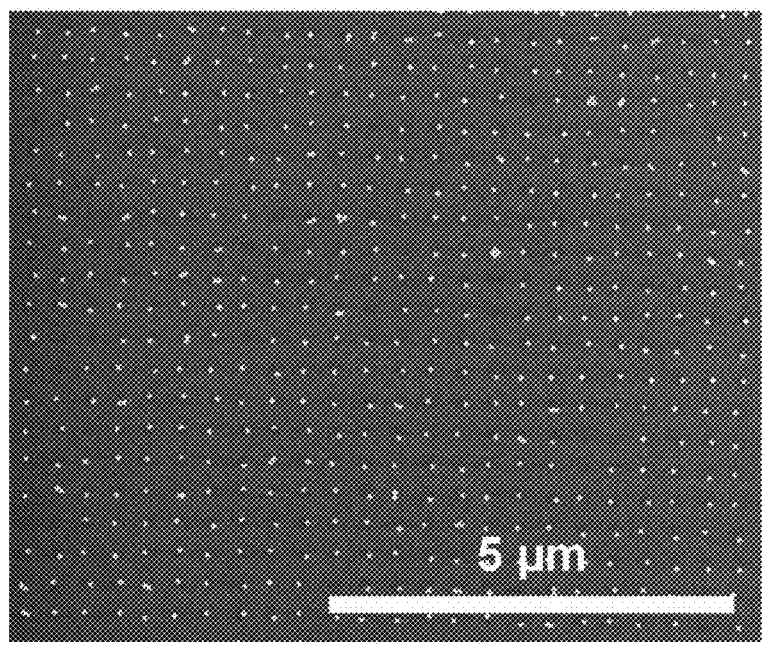
FIG. 6 shows a scanning electron microscope micrograph of a scatterer array. Scale bar 5 μm
Figure 7:
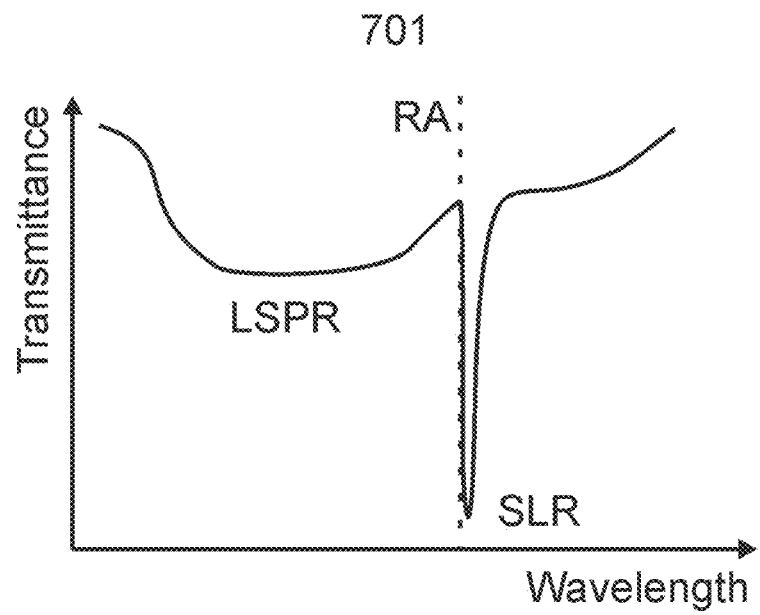
FIG. 7 shows a visible transmission spectrum of a scatterer array comprising a characteristic broad LSPR dip, position of the RA and a narrow SLR dip.
Figure 8:
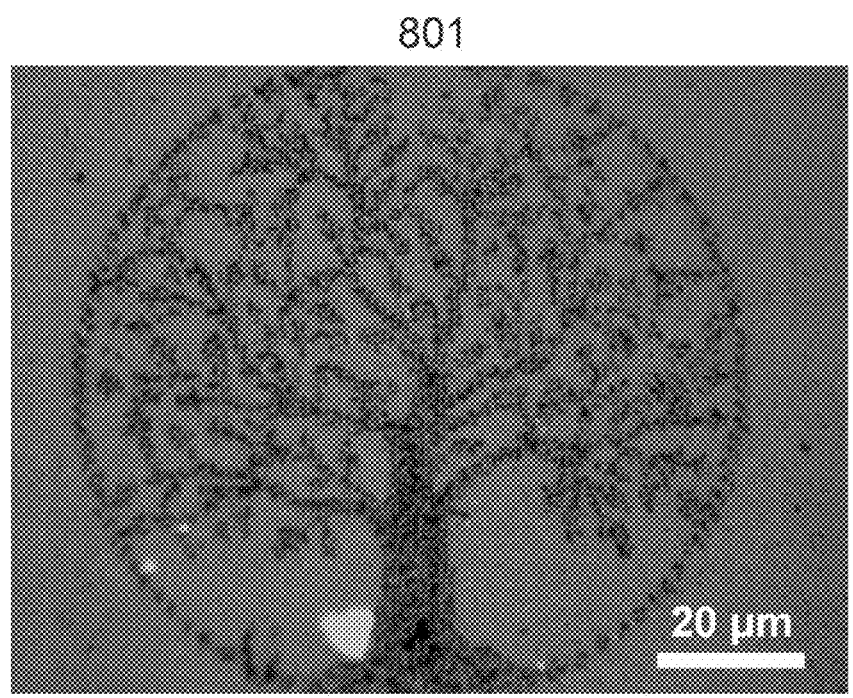
FIG. 8 shows a dark field optical microscope micrograph of a customized scatterer array with a monochrome image. Scale bar 20 μm.
Figure 9:
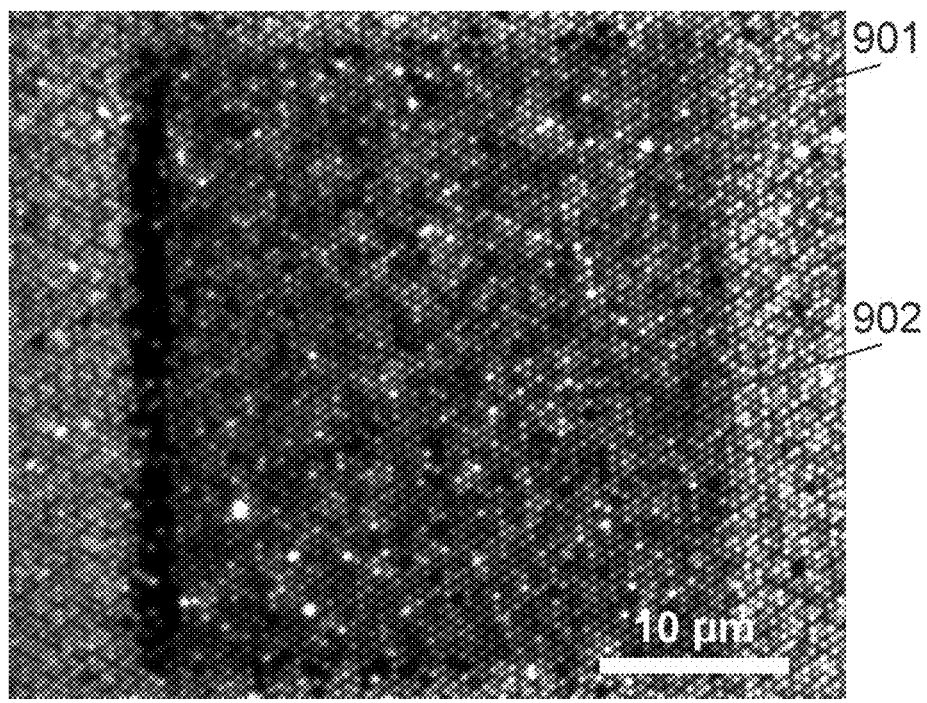
FIG. 9 shows a dark field optical microscope micrograph of a scatterer array with a colour-based customization, where different grey scale values represents different colours.
Figure 10:
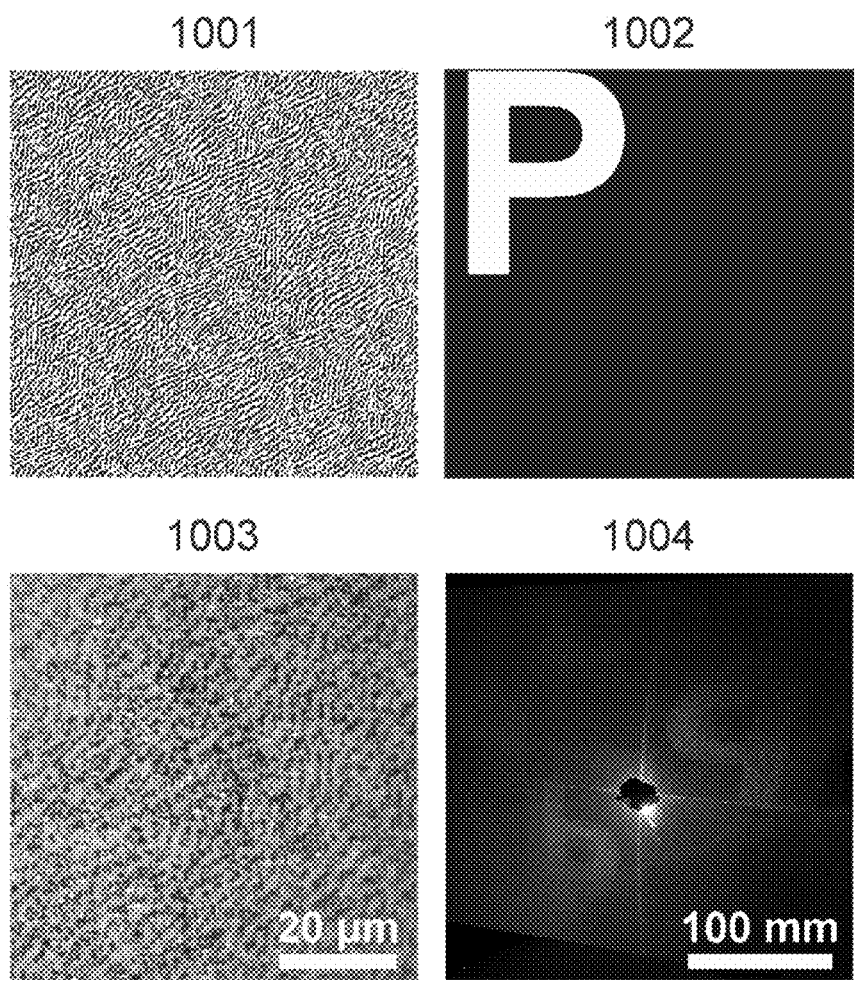
FIG. 10 shows a computer-generated hologram generated from an image of a letter "P", a dark field optical microscope micrograph of a laser customized scatterer array with computer-generated hologram (scale bar 20 μm), and laser imposed CGH reconstruction from a customized scatterer array on a screen using illumination from a green laser pointer (scale bar 100 mm).
Figure 11:
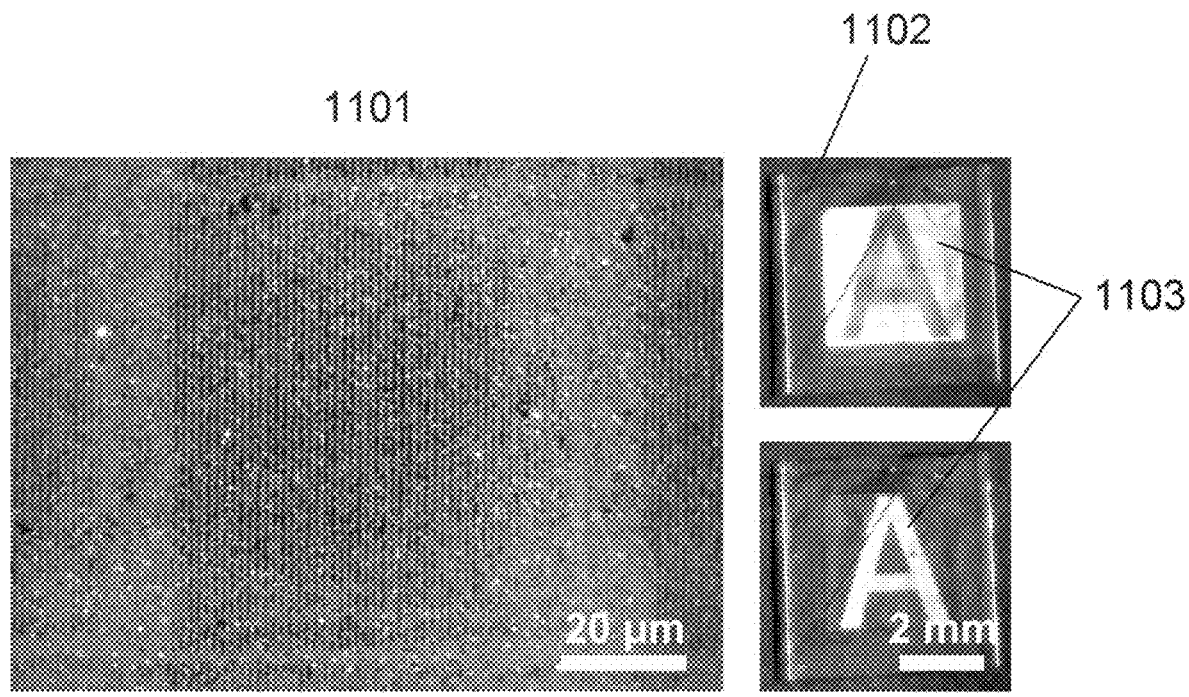
FIG. 11 shows a dark field optical microscope micrograph of a customized scatterer array after irradiation with two laser beam interference fringes. Multiple holo-pixels forming a dot-matrix hologram are seen (scale bar 20 μm), a camcorder image of the same dot matrix hologram diffraction under different illumination conditions when the background around the letter "A" is diffracting light towards the observer, and a camcorder image of the dot matrix hologram diffraction when the letter "A" is diffracting light towards the observer (scale bar 2 mm).
Figure 12:
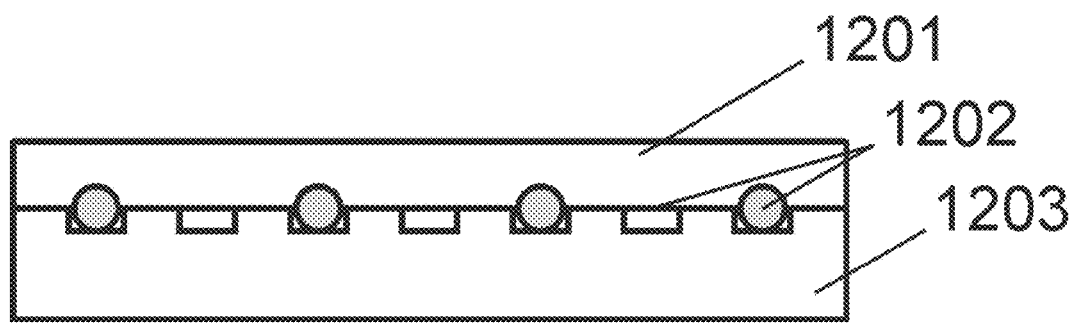
FIG. 12 shows a customized scatterer pattern with a protective transparent cover.
Figure 13:
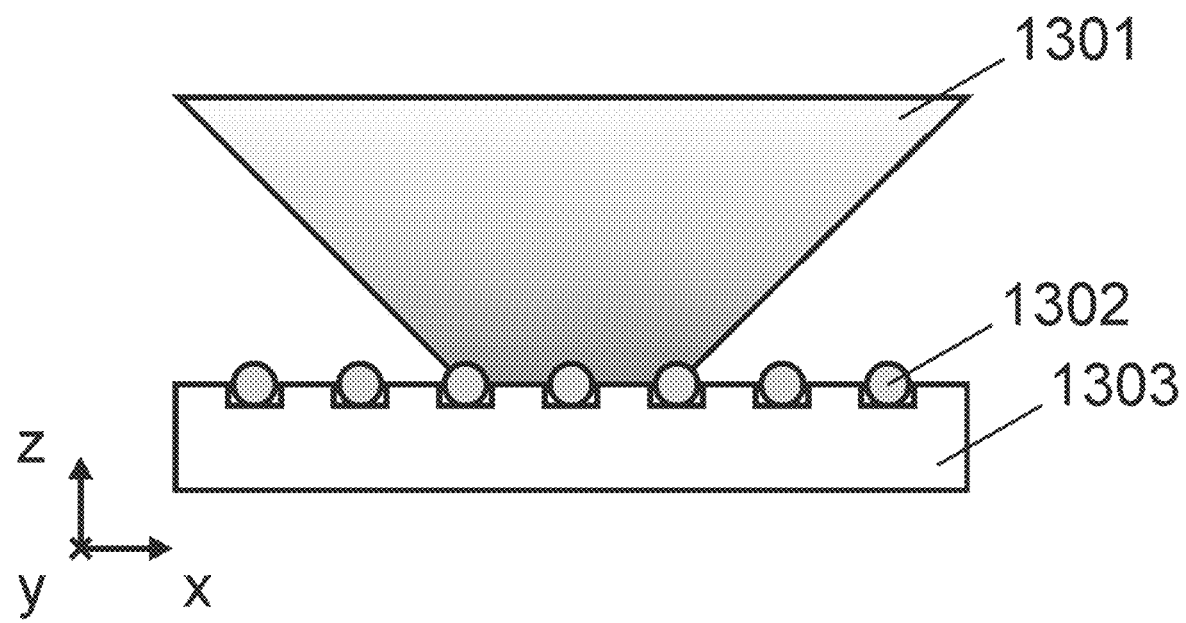
FIG. 13 shows a nearly diffraction limited focused laser beam irradiation used for customization of a scatterer array. Arrows indicate the option to scan either the sample or the beam.
Figure 14:
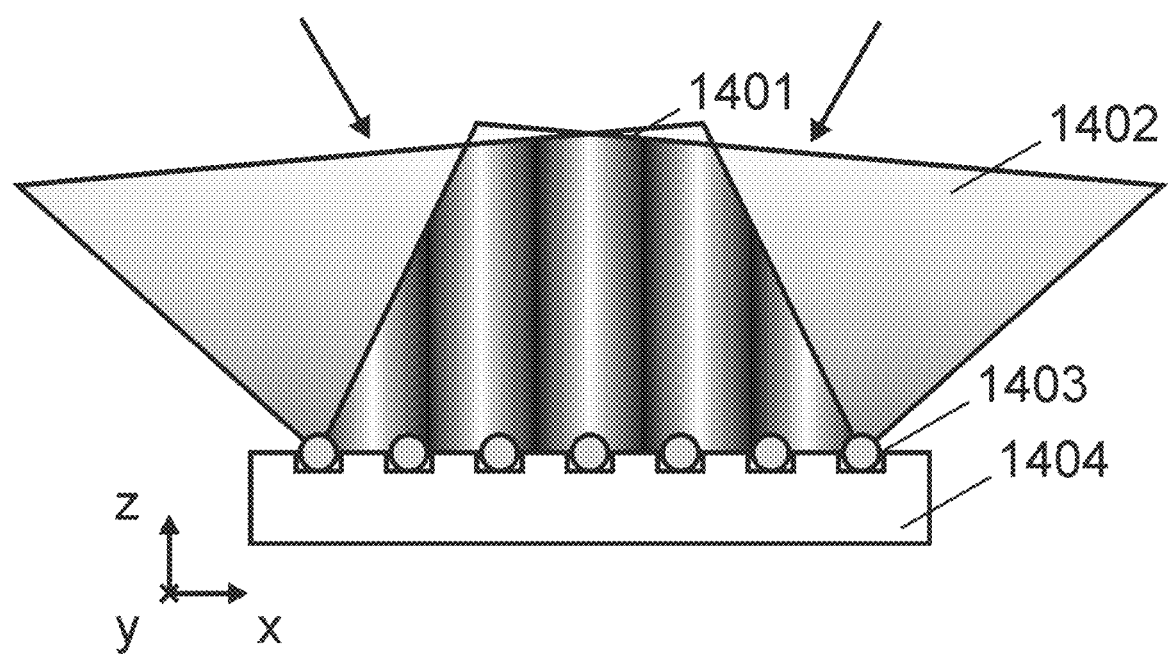
FIG. 14 shows a scheme for patterning subwavelength regular patterns on a scatterer-containing template utilizing holographic lithography.

In an embodiment of the invention the optical scatterers could be made to follow a defined pattern by affixing them to some or all described substrate features via a self-assembly type method such as capillary force assisted particle assembly (FIG. 4). A drop of the colloidal solution (402) is confined between a stationary glass slide (401) and the patterned substrate (404). The substrate is held at a predefined temperature (406) and translated at a predefined speed towards the indicated direction (405). The order of nanoparticles (403) matches the pattern defined, but unique randomness is maintained by deposition defects (601) (e.g., unfilled pits (204), multiple particles per pit (205)) and positional/orientation randomness (i.e., if the particle is smaller than the hole). The depth of the holes is related to the size of the optical scatterers and should be on the same order of magnitude to maintain the overall majority of single particles per pit. Typical deposition conditions are 0.1-10 µm/s translation speed and 10° C. above the atmospheric dew point. Typically, the highest stable concentration can be used. An embodiment produced according to this example will have an arbitrary assembly yield, therefore featuring a unique nanoparticle pattern (501, 601) that can already be used as an anti-counterfeiting feature, because no two depositions can be the same, and a designated verification area could be verified via microscopy.

In some embodiments of the invention, substrate sheets with the scatterers already arranged or produced by industrial processing can be available for users to customize by laser processing and produce secure identity and anti-counterfeiting tags.

One more embodiment of the invention comprises optical scatterers that are separated from adjacent optical scatterers to form a regular pattern (501, 601), such as a square lattice, rectangular lattice, triangular lattice, or any other two-dimensional lattice that can be defined by a unit cell and some periodicity. This opens the way to produce substrates (201) with said superficial features by parallel lithography means, such as holographic lithography.

Additionally, the introduction of regularity in the pattern allows a condition called Rayleigh anomaly (RA). It is a condition for light to diffract in the plane of the periodic features, and the energy of light fulfilling this condition can be calculated by $$E = \frac{\hbar c}{n} |\vec{k}_{//} + \vec{G}|, \qquad \text{Equation (1)}$$

where E is the energy of RA, $\hbar$—reduced Planck's constant, c—speed of light in vacuum, n—refractive index of the medium the nanoparticles are embedded in, $k_{//}$—in plane projection of the wavevector (for normal incidence equals 0), and G—the grating vector. The scattering spectrum of the optical scatterers could overlap this RA energy and produce a phenomenon called surface lattice resonance (SLR), which features narrow extinction peaks, and therefore a security tag possessing the surface lattice resonance will have an additional security feature verifiable by means of UV-vis-NIR spectrophotometry. In one more of the embodiments, the localised surface plasmon resonance (LSPR) of plasmonic nanoparticles centred at 500 nm with a FWHM of 100 nm and overlapping an RA at 600 nm could generate an SLR (701). To design this kind of security feature, the designer needs to either know the scattering signature before designing the substrate pattern (and defining the RA energy as a consequence), or vice versa. The optical scattering characteristics can be obtained analytically before producing the pattern, i.e., through modelling and/or analytical solutions, such as FEM and using the Mie solution for optical scatterers, or experimentally after synthesis, using standard UV-vis-NIR spectrophotometry techniques.

Regardless of the type of pattern, the optical scatterers could be further modified by selectively and intentionally changing the scattering signature or removing some of them to produce additional, custom, unique, and verifiable features. The modification can be binary, i.e., the scatterer either is or is not affixed to the substrate in a defined location, or continuous, i.e., the scatterer can have a different scattering signature compared to adjacent scatterers.

In one more embodiment of the invention, the optical scatterers could be arranged in a custom way so that the overall binary (801) or continuously varying colour pattern (902) would constitute a larger visually or microscopically identifiable image and/or text (102, 103). An example of a binary image of a tree is observable through an optical microscope because the nanoparticles were selectively removed (801). An example of a colour-based modification is observable through an optical microscope because the nanoparticles were selectively reshaped (902). The customization can include different size and/or font letters, linear and/or matrix bar codes, mathematically defined curves, and other graphical information.

Additionally, the binary pattern (1003) could constitute a computer-generated hologram (104, 1001) of an image (1002). In this embodiment of the invention, the validity of the anti-counterfeiting tag could be verified by shining monochromatic light onto the tag and observing a far-field image (1004) that was encoded by the Iterative Fourier transform algorithm using not less than 100 cycles.

Moreover, the binary pattern could constitute optical scatterers arranged in periodic lines and confined in defined areas, holo pixels (105, 1101). A large array of such areas with different orientations and periodicities of these lines can produce a dot matrix hologram (1102). Upon illumination with white light, holographic rainbow effect with an encoded image is observed (1103).

Finally, an embodiment of the invention could have an additional layer of transparent material (1201), such as a transparent polymer PDMS, to increase the robustness of the device while maintaining the colours produced by the optical scatterer pattern (1202). In one example, the described PDMS prepolymer mix could be poured directly on the substrate (1203) with pristine or customized optical scatterers (1202) and be left to cure. This process should be the last step of the production, regardless of the type or complexity of the device disclosed herein.

An embodiment of the method to produce binary (102, 104, 105, 801, 1003, 1101) or colour-based (103, 902) patterns can be carried out by femtosecond laser irradiation with a high numerical aperture objective and precise translation with a motorized three-axis stage with respect to the focus of a stationary, nearly diffraction limited laser beam focused (1301) on scatterer arrays (1302) on a substrate (1303). Alternatively, the laser beam can be scanned over the scatterer array on a substrate, e. g., employing a galvanometer scanner and/or laser head translation. Laser modification threshold is reduced by selecting a wavelength close to the extinction cross-section peak of the optical scatterers, therefore improving the probability of interaction. Multiple photon absorption is also possible when ultrashort pulses are used.

The interaction of light with free-standing optical scatterers induces several effects depending on the energy density and the number of optical scatterers in the vicinity. Firstly, scatterers can remelt, lose their initial form, and translate into spheroids. Secondly, the scatterers can combine to form bigger structures or fracture into smaller ones. These two effects contribute to colour-based patterning (902). Finally, they can be removed from the substrate completely. The latter is useful when forming binary patterns (801). In our embodiment, 15 mJ/cm² range fluence is provided by irradiation with the second harmonic (515 nm) of 270 fs pulse length Yb:KGW laser. Local changes of size-related light scattering properties can be seen using dark field optical microscopy. The customization through binary or colour-based patterns with a single focused laser beam (1301) is limited by the spot size of the focused laser beam. If the spot size is larger than the interparticle distance of the optical scatterers, more than one scatterer may be affected.

A computer-generated hologram (1001) can be calculated using an iterative Fourier transform algorithm and imposed on the scatterer array as a binary pattern (1003). The pattern is visible using a microscope, but it is only understandable through a mathematical 2D Fourier transformation; or when it is illuminated by a laser. The encoded image is then visible on a screen (1004) with a naked eye.

Two or more interfering coherent laser beams (1402) can be used to form periodic interference fringes (1401) instead of diffraction limited spot size (1301). When two beams are used, the pitch of the grating can be calculated by $$\Lambda = \frac{\lambda}{2}/\sin\left(\frac{\theta}{2}\right),\qquad \text{Equation (2)}$$

where $\Lambda$ is the pitch of a grating, $\lambda$ is the wavelength of interfering light, $\theta$ is the angle between the two interfering beams. More complex two-dimensional interference patterns are available when more than two laser beams are interfering and the phase difference and/or polarization of the beams is varied in a controlled fashion by introducing additional optical paths and waveplates, respectively. Irradiating the scatterer arrays (1403) on a substrate (1404) results in selective removal of scatters along periodically repeated high intensity areas (interference fringes, 1401). Usually, rectangular or oval areas are affected (1101) depending on the beam intensity distribution. By tailoring the periodicity and the angle of the interference fringes (1401) in the XY plane, one can construct an array of closely spaced holo-pixels and form a dot-matrix hologram (105, 1102). The dot-matrix holograms formed by customized optical scatterer arrays diffract light in a designed fashion that can be seen by the naked eye (1103).

NON-PATENT LITERATURE

1 Marcus S. Carstensen, Xiaolong Zhu, Oseze Esther Iyore, N. Asger Mortensen, Uriel Levy, Anders Kristensen, Holographic Resonant Laser Printing of Metasurfaces Using Plasmonic Template. ACS Photonics 2018, 5, 1665-1670, https://doi.org/10.1021/acsphotonics.7b01358

2 Shikai Denga, Ran Li, Jeong-Eun Park, Jun Guan, Priscilla Choo, Jingtian Hu, Paul J. M. Smeets, Teri W. Odom, Ultranarrow plasmon resonances from annealed nanoparticle lattices. PNAS 2020, vol. 117 No. 38 23380-23384 https://doi.org/10.1073/pnas.2008818117.

3 Andrea Tao, Prasert Sinsermsuksakul, and Peidong Yang, Polyhedral Silver Nanocrystals with Distinct Scattering Signatures. Angew. Chem. Int. Ed. 2006, 45, 4597-4601, https://doi.org/10.1002/anie.200601277.

4 Neus G. Bastus, Florind Merkoci, Jordi Piella, and Victor Puntes, Synthesis of Highly Monodisperse Citrate-Stabilized Silver Nanoparticles of up to 200 nm: Kinetic Control and Catalytic Properties. Chem. Mater. 2014, 26, 2836-2846. https://doi.org/10.1021/cm500316k.

The invention claimed is:

1. A secure identity optical device for anti-counterfeiting measures which is configured to produce visually (801, 902, 1004, 1103), spectroscopically (701), or microscopically (102, 103, 801, 902) verifiable security features wherein the optical device comprises at least:
   a substrate (201); and
   a plurality of optical scatterers (101, 202) being plasmonic nanoparticles affixed onto the substrate (201) and separated from adjacent scatterers (202) by a distance to form a two-dimensional pattern of said optical scatterers;
   characterized in that said optical scatterer pattern comprises at least one of:
   a) a specifically designed binary pattern (102, 105, 104, 801, 1003, 1101), wherein some scatterers either are (202) or are not (204) in a selected location on the substrate;
   b) a specifically designed colour-based pattern (103, 902), wherein some scatterers (902) scatter a measurably different colour of light compared to adjacent scatterers (901);
   c) a specifically designed photonic interaction between said scatterers (202), wherein said interaction results in features in an optical spectrum (701); or
   d) a combination of any of a), b) and c).

2. The device of claim 1, wherein said scatterer pattern comprises at least one of:
   a) a varying distance between adjacent scatterers (202, 601);
   b) a plurality of optical scatterer arrangements, comprising more than one optical scatterers within each scatterer arrangements selected from scatterer dimers (205), trimers, and tetramers.

3. The device of claim 1, wherein said pattern of optical scatterers is arranged so that, upon illuminating with electromagnetic radiation, it provides an optical Rayleigh spectral anomaly condition, producing a surface lattice resonance SLR spectral feature in the spectrum of the electromagnetic radiation due to the combination of said Rayleigh anomaly and localized surface plasmon resonance LSPR of said optical scatterers.

4. The device of claim 1, wherein said binary pattern constitutes a computer-generated hologram (1003) of an image (1002), which can be reconstructed in a far-field by monochromatic illumination (1004).

5. The device of claim 1, wherein said binary pattern constitutes an array of finite-sized areas, wherein each area comprising lines of scatterers arranged as halo-pixels (1101) whereby said halo-pixel array produces a visual holographic image (1103).

6. The device of claim 1, further comprising a transparent superstrate material (1201) secured on top of the substrate (1203) and enclosing said scatterers (1202) underneath.

7. A method of producing the device of claim 1, comprising steps of:
providing a substrate (201) with an array of obstacles (203) for allocating scatterers onto the substrate;
synthesizing a colloid solution (402) comprising monodisperse scatterers (403);
depositing the colloid solution (402) onto the substrate (404) with an array of obstacles (407) wherein self-assembly of said scatterers (403) occurs on said substrate.

8. The method of claim 7, further comprising a step of depositing one or more transparent protective layers (1201) on top of the substrate (1203).

9. A method of creating a customized binary pattern on the device of claim 1, comprising steps of:
providing a substrate (1303) with an array of scatterers (1302);
providing one or more laser beams (1301) of monochromatic light radiation;
providing optomechanical means to focus at least one laser beam (1301) onto said substrate (1303) with the array of scatterers (1302);
translating the substrate (1303) or/and positioning the laser spot (1301) over said substrate (1303);
providing means of controlling the laser patterning process;
focusing the laser beam energy selectively to the array of scatterers (1302) causing any one of: selective reshaping, fracturing, coalescence, removal of said scatterers (1302), or any combination thereof; and
repeating the penultimate step a plurality of times for a plurality of spots in different locations of the substrate (1303) to define a custom pattern in the array of scatterers (102, 103, 104, 801, 902, 1003).

10. A method of verifying the device of claim 1, comprising any steps of:
verifying signatures in the optical spectra (701) scattered by the device under illumination,
verifying a binary or colour image or a text present on the device seen through an optical microscope under dark-field illumination (102, 103, 105, 501, 801, 901),
verifying a dot-matrix hologram under white-light illumination (1103), verifying on a screen when a computer-generated hologram present on the device is illuminated using monochromatic visible light (1004), or
verifying by any combination of above steps, depending on customizations on the device by the method of claim 9.

11. The method of claim 9, wherein the light radiation is provided in the form of two or more laser beams (1402) that are spatially and temporally overlapped and concentrated into a single spot on the surface (1403) by means of directing and focusing optics and form an interference pattern (1401) with a laterally varying intensity with some periodicity, said interference pattern (1401) applied onto the array of scatterers (1403).

12. The method of claim 11, wherein the overlapping laser beams interference and periodicity pattern are controlled by using any of the following:
varying a number of of the overlapping laser beams (1402);
varying a light phase and/or polarization of each laser beam (1402);
varying the angle between overlapping beams (1402);
varying a spatial orientation of the overlapping laser beams interference pattern (1401) with respect to the substrate (1404) and the array of scatterers (1403).

13. The method of claim 9, wherein said scatterers (1302) are selectively affected by the focused laser beam (1301), to form a binary pattern (102, 105, 104), a colour-based pattern (103), or a combination of the binary pattern and the colour-based pattern, by one or more steps:
removal of the scatterer from the array of scatterers (1302; a group thereof;
reshaping a scatterer so that the array of scatterers (1302) locally changes the central wavelength of scattered electromagnetic radiation;
fracturing a scatterer into smaller scatterers so that said array (1302) gains new scatterers having shifted central wavelength of scattered electromagnetic radiation; and
coalescing into bigger scatterers so that the array of scatterers (1302) locally changes its central wavelength of scattered electromagnetic radiation.

14. The method of claim 9, wherein the multiple laser beams (1402) are applied on the scatterers' array to impose diffraction gratings comprising a decorative pattern where each separate spot contains a predefined pattern imposed in the two-dimensional scatterer array (1101), thereby the overall system forms a dot-matrix hologram (1102).

15. The method of claim 9, wherein the at least one laser beam (1301) is used to spatially alter the array of scatterers (1302) to form binary patterns comprising any combination of:
a microtext, a nanotext, or any combination thereof (102);
a two-dimensional binary image (801);
a computer-generated-hologram (104, 1003) of an image (1002); and
an array of larger pixels comprising lines of scatterers (105, 1101) forming a dot matrix hologram (1102).

* * * * *